United States Patent
Niemax

(10) Patent No.: US 8,164,915 B2
(45) Date of Patent: Apr. 24, 2012

(54) SYSTEM FOR ELECTRONIC COMPONENTS MOUNTED ON A CIRCUIT BOARD

(75) Inventor: Jens Niemax, Unterhaching (DE)

(73) Assignee: Qimonda AG, Munich (DE)

(*) Notice: Subject to any disclaimer, the term of this patent is extended or adjusted under 35 U.S.C. 154(b) by 1191 days.

(21) Appl. No.: 11/942,308

(22) Filed: Nov. 19, 2007

(65) Prior Publication Data

US 2009/0129029 A1    May 21, 2009

(51) Int. Cl.
*H05K 1/18* (2006.01)

(52) U.S. Cl. ........ 361/761; 361/700; 361/701; 174/259; 174/260

(58) Field of Classification Search .......... 174/259–260; 439/66, 71–74; 361/760–761, 700–710
See application file for complete search history.

(56) References Cited

U.S. PATENT DOCUMENTS

| | | | | |
|---|---|---|---|---|
| 6,019,610 A | * | 2/2000 | Glatts, III | 439/66 |
| 6,854,985 B1 | * | 2/2005 | Weiss | 439/91 |

* cited by examiner

*Primary Examiner* — Tuan T Dinh
(74) *Attorney, Agent, or Firm* — Dicke, Billig & Czaja, PLLC

(57) ABSTRACT

A system for electronic components mounted on a circuit board is disclosed. One embodiment provides placing an elastic, anisotropically conductive material on top of a printed circuit board. An electronic component is placed over the elastic, anisotropically conductive material, fixing the electronic component on the printed circuit board.

5 Claims, 4 Drawing Sheets

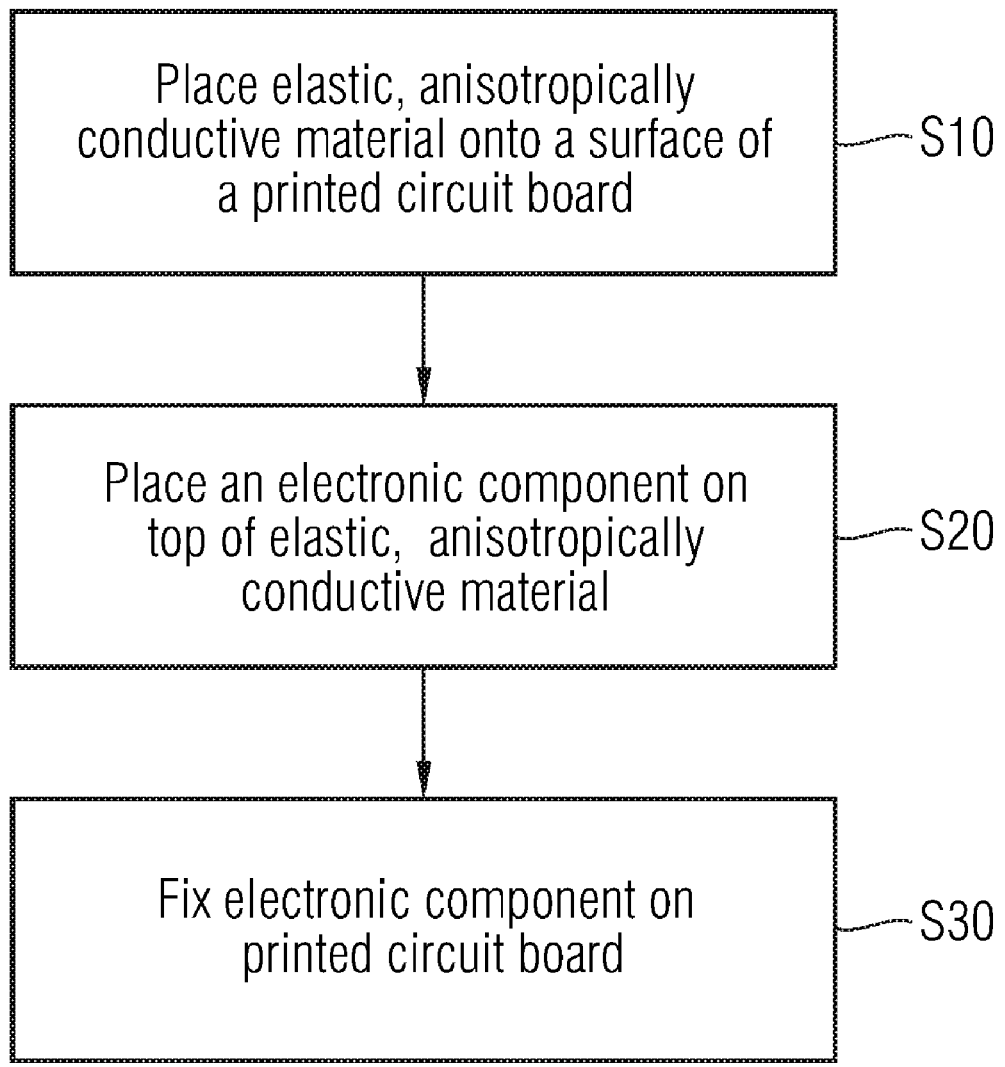

SYSTEM FOR ELECTRONIC COMPONENTS MOUNTED ON A CIRCUIT BOARD

BACKGROUND

Electronic components, for example dynamic random access memories (DRAMs), integrated circuits (ICs), transistors, need to be fixed onto printed circuit boards (PCB). This may be done by a soldering process which is carried out at comparably high temperatures of about 120° C. to 130° C. or more in order to provide a permanent connection between the electronic component and the PCB. If such a connection should be disconnected, for example in case that a defective electronic component has to be replaced, it is necessary to carry out a desoldering process which again involves heating of the soldering point. Also other methods for fixing an electronic component on a printed circuit board, like for example crimping, have been considered in the past.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates a flowchart of one embodiment of a method.

DETAILED DESCRIPTION

Figure 1:
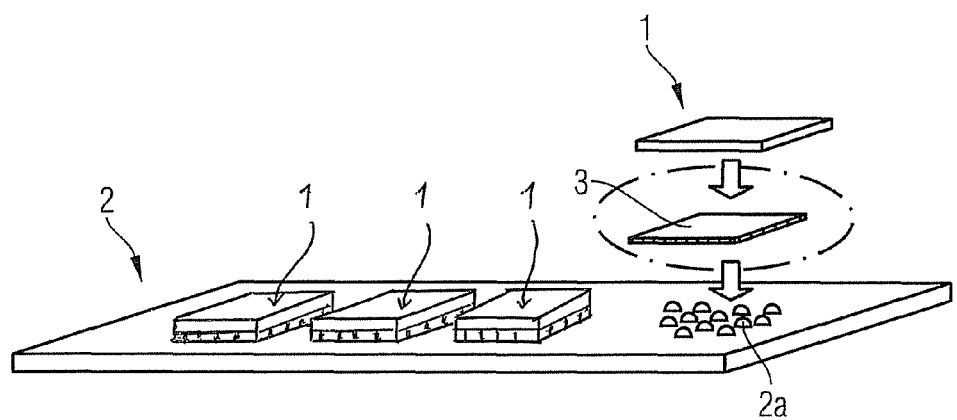
FIG. 1 illustrates the principle of a method according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the Figures, corresponding elements have been given the same reference numerals.

FIG. 1 illustrates a principle of connecting/fixing an electronic component 1 onto a printed circuit board 2 according to one embodiment. Several electronic components 1 can be connected to the same printed circuit board 2, either one after the other, as it is depicted, or at the same time. The electronic components may be of the same type or of different types, for example different types of ICs, semiconductor memories like DRAMs or the like, or any other type of electric or electronic component which is needed for realizing a desired electronic circuit.

FIG. 1 illustrates four electronic components 1, three of them in a state already mounted onto the printed circuit board 2. Electronic component 1 depicted on the right side of FIG. 1 is in the process of being placed onto the circuit board 2. At the position at which the electronic component 1 is to be placed, i.e. on the right side of the upper face of the printed circuit board 2, contacts 2a for connection with corresponding contacts, e.g., pins (not illustrated) of the electronic component 1 are provided.

An elastic, anisotropically conductive material, for example a conductive elastomer 3, which is an elastomer having metallic particles or metallic elements distributed therein, is placed onto the printed circuit board 2 at the position where the electronic component 1 is to be fixed onto the printed circuit board 2. Generally, an elastic, anisotropically conductive material is an elastic substance which is electrically conductive in a certain direction only, for example in orthogonal direction, and is electrically insulating in the other directions. As it is depicted in the Figure, the conductive elastomer 3 comes in the form of a sheet having a size and a shape so as to cover the contacts 2a of the printed circuit board 2 necessary for establishing electronic contact to the corresponding pins of the electronic component 1. In one embodiment illustrated, the shape and size of the conductive elastomer corresponds to that of the electronic component 1.

After the conductive elastomer 3 has been applied onto the printed circuit board 2, the electronic component 1 can be placed onto the conductive elastomer 3 so that the pins of the electronic component 1 are electrically connected to the corresponding contacts 2a of the printed circuit board 2 via the conductive particles contained in the conductive elastomer 3.

In order to enhance the fixation of the electronic component 1 on the circuit board 2, a force may be exerted onto the electronic component 1 in the direction illustrated by the bold arrows in FIG. 1, i.e. substantially perpendicular to the surface of the printed circuit board 2. That force may be a permanent force or a force being exerted only during a fixed interval of time during the manufacturing process, depending on the kind of conductive elastomer used. Most kinds of conductive elastomers illustrate only a low degree of adhesive strength so that a permanent pressure has to be exerted in order to keep the electronic component 1 fixed on the conductive elastomer 3 and thus on the printed circuit board 2.

The connection between the electronic components 1 and the printed circuit board 2 as described above can avoid high temperatures during the manufacturing process which would be present in the soldering method. In this manner, thermal stress to the electronic component is reduced. Especially semiconductor components are prone to failures caused by thermal damage.

In connection with printed circuit boards having several DRAM components, a typical type of failure is the single cell fail (SCF). The occurrence of one single cell fail renders a complete module unsellable. The steadily rising memory densities of DRAM components makes the occurrence of single cell fails during the soldering process more and more likely.

Due to the fact that thermal stress can be reduced to a great extent by the above described method, time savings can be achieved when testing the thus manufactured modules or integrated circuits with regard to failures. Usually, those tests include functional tests which include read/write processes with regard to all cells of the memory array. Since those tests constitute a large part of the test time for a whole module, considerable time savings at testing can be achieved by the above-described method. As an example, considering an RDIMM (Registered Dual Inline Memory Module) having a storage capacity of 2 GB. For this module type functional tests make more than 50% of the total module testing time. The time needed for testing DRAM components increases in line with the memory density. With other words, if the density of semiconductor memories is increasing, additional ATE (Automatic Test Equipment) systems need to be purchased to maintain the total production capacity.

A module including one defective semiconductor component cannot be sold, as mentioned above, and therefore, that component has to be replaced by a non-defective component prior selling it. The process of exchanging a defective component is known as "rework". The rework process includes loosening the solder connection ("desoldering"), removing the defective electronic component and carrying out a second soldering process in which the new functional electronic components is fixed onto the circuit board.

According to one embodiment, not only the number of reworks necessary can be significantly reduced, but, if such a rework in connection with a defective electronic component has to be carried out, this can be done quickly and easily. Due to the fact that no solder connection has to be loosened in order to take off a defective component, the replacement can be carried out simply reversing the force illustrated by the bold arrows depicted in FIG. 1.

Figure 1A:
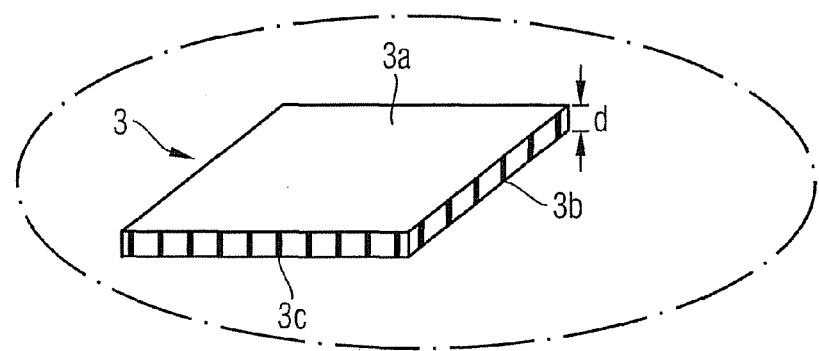
FIG. 1A illustrates a detail of FIG. 1.

In FIG. 1A a detail of a conductive elastomer for establishing an electric contact between the printed circuit board 2 and the electronic component 1 is illustrated in enlarged view. The conductive elastomer is a thin sheet, for example with a thickness d between 0.5 mm and 1.00 mm (0.020 inches to 0.040 inches). Of course, the thickness might be chosen according to actual requirements, and therefore, also elastomer sheets having a higher or lower thickness can be taken into consideration. The elastomer sheet may be fabricated, for example, from rubber, especially silicon rubber. The elastomer sheet illustrated in FIG. 1A has an upper face 3a and a lower face 3b, the lower face 3b contacting the printed circuit board 2 and the upper face 3a contacting the electronic component 1 when being used in the process described above.

Distributed within the body 3c of the elastomer sheet 3, there are conductive particles 3d which are, in the embodiment illustrated, small conductive wires running orthogonal to the faces of the sheet 3. However, the conductive particles 3d may also take other shapes, for example a ball-shape. The conductive particles 3d are dimensioned and distributed so that a conductive connection is provided between the pins of the electronic component 1 and the corresponding contacts 2a on the printed circuit board 2.

FIG. 2 illustrates a flowchart containing processes of one embodiment. As illustrated at S10, an elastic, anisotropically conductive material, for example a conductive elastomer, is placed onto the surface of a printed circuit board at a position where an electronic component is to be fixed. As mentioned above, the conductive elastomer may be in the form of a sheet having a thickness that is small in comparison to its other dimensions (length and width). The surfaces of the sheet can be dimensioned and to match the shape of the electronic component to be fixed therewith.

At S20, the electronic component is placed onto the already attached elastic, anisotropically conductive material.

S30 includes exerting a force on the electronic component in direction perpendicular to the surface of the printed circuit board in order to permanently fix the electronic component. The pressure can be, for example, exerted by mechanical means, for example a clip, clamp or other. The electrical connection is established via the anisotropically conductive material.

The yield, e.g., the percentage of working devices during manufacturing, may be enhanced by the above-described method in comparison to the usually adopted soldering method. Of course, the usual back-end tests still have to be carried out. If it turns out in such a test that one of the electronic components is nevertheless defective, a further time saving can be achieved due to the fact that the rework is less time consuming than the desoldering process.

Due to the ease of exchanging electronic components fixed onto a circuit board by the above method, time saving can be achieved also during product development because electronic components can be quickly applied and removed for test purposes during development. Therefore, the time to market of a new product is shortened.

Figure 3:
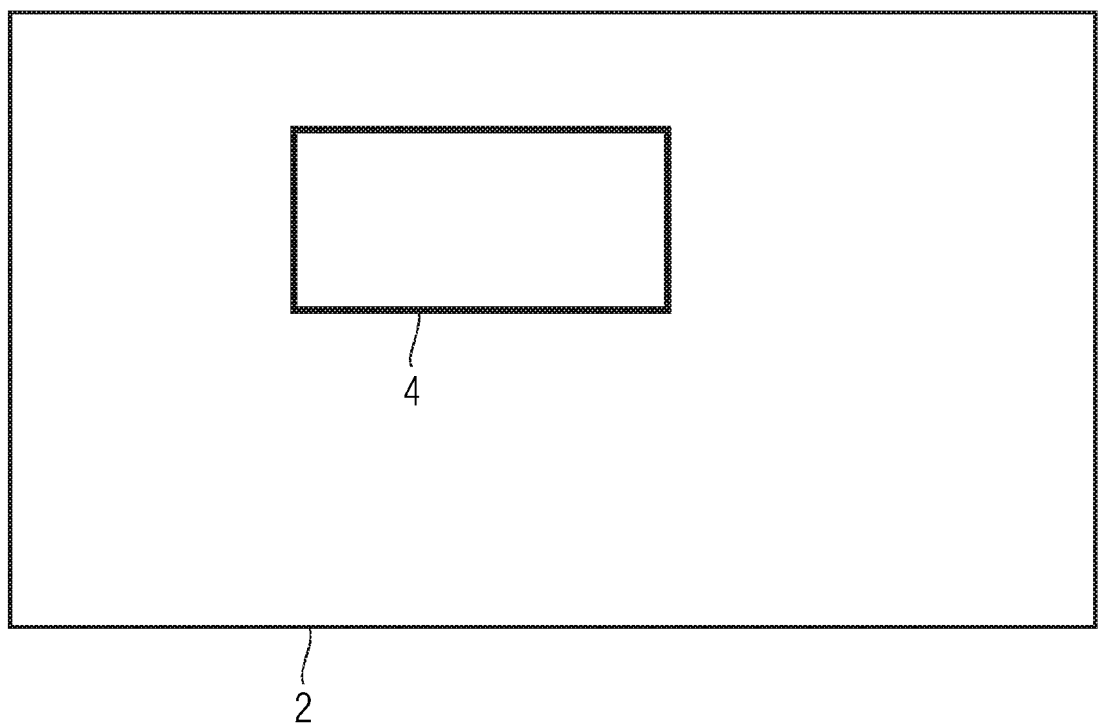
FIG. 3 illustrates a circuit board with a frame prior to the attachment of the electronic component.

In order to achieve a correct placement of the electronic component onto the circuit board, it is possible to include a further process in the manufacturing process which is the application of a frame 4 that can be seen from FIG. 3. The shape of frame 4 must match that of the electronic component 1. In order to exactly position the frame 4 onto the printed circuit board 2 at a predefined position, marks can be provided on the printed circuit board 2 in advance.

Furthermore, frame 4 may be placed onto the printed circuit board 2 before the attachment of the conductive elastomer sheet 3 so that already the conductive elastomer sheet 3 can be perfectly positioned. Besides, the frame 4 also serves for guiding the electronic component 1 during the assembly process.

The frame 4 may either be a permanent frame or a frame removed after the application of the elastomer sheet 3 and/or the electronic component 1. For example, a plastic or rubber material can be used for frame 4, which can be glued onto or otherwise connected with the face of the printed circuit board 2.

Figure 3A:
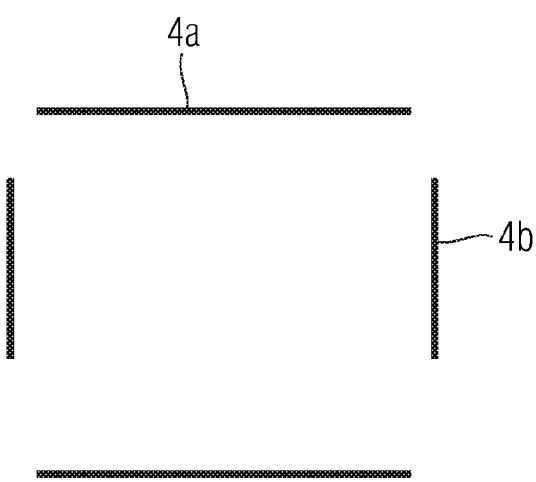
FIG. 3A illustrates the frame of FIG. 3 in more details.

As it can be seen from FIG. 3a, the frame 4 may be composed of several, for example four, single bands 4a, 4b of the plastic or rubber material.

Figure 4:
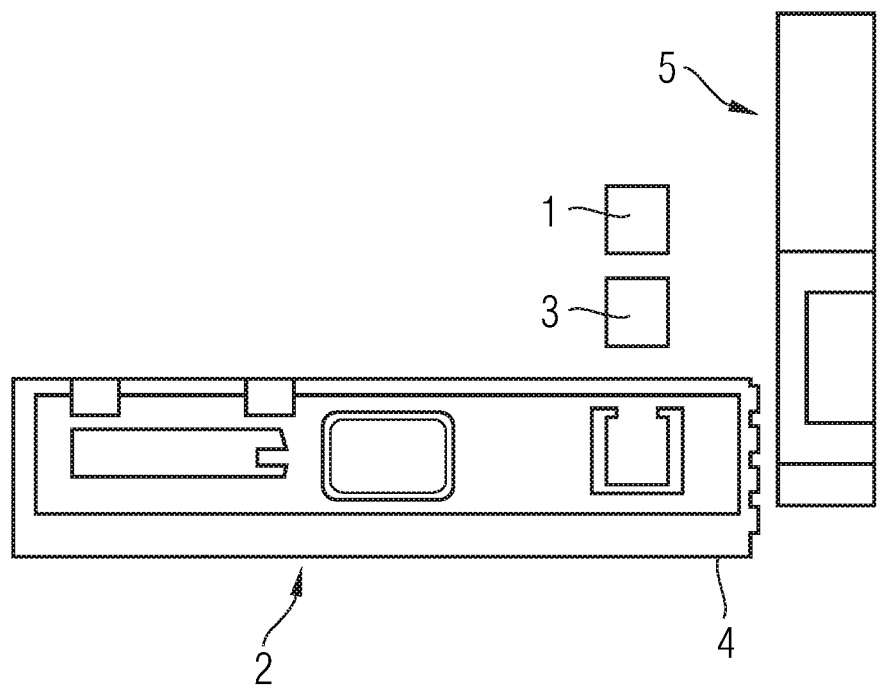
FIG. 4 illustrates an example of the elements involved in a method according to one embodiment.

FIG. 4 illustrates the different elements which have been used to test the underlying idea of the present invention. In FIG. 4, the elements described already above in connection with FIGS. 1 and 3 have the same reference signs as in FIGS. 1 and 3. The elements of the system are illustrated before carrying out the process of mounting the electronic component 1 onto the printed circuit board 2.

The printed circuit board 2 used was a FBDIMM (raw card A, 512 MB). As depicted at the right side of FIG. 4, an electronic memory component 1 was removed from the FBDIMM. The position of the removed component was marked by frame 4 of thin plastic strips glued onto the FBDIMM. The conductive elastomer sheet 3 which is available under the trade name "Pariposer" from Paricon was placed into the frame 4. The shape and dimensions of the frame had been chosen so as to be able to exactly locate the free electronic component 1 with regard to the contacts (not illustrated) of the FBDIMM. For test purposes, a clip 5 illustrated on the right hand side of FIG. 4 was used in order to exert a force between the electronic component 1 and the FBDIMM.

The test module as composed above was inserted into a motherboard (not illustrated) which was then booted. In order to test the stability of the system, a memory test program was started and run for over 10 hours. No failures occurred during this time period proofing the feasibility of the presented concept.

Figure 5:
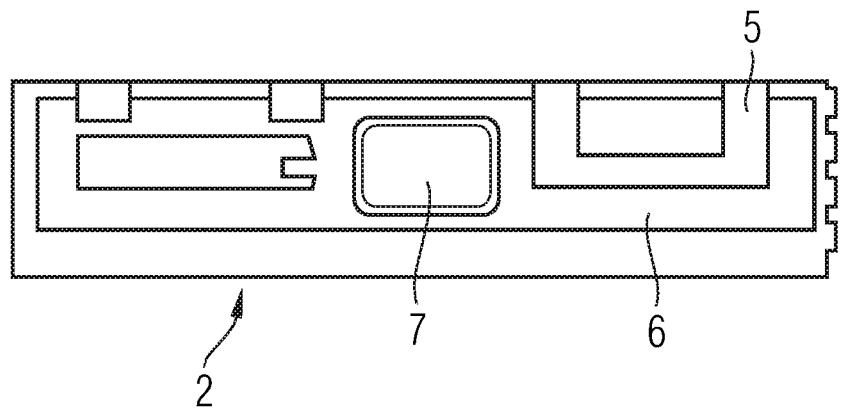
FIG. 5 illustrates one embodiment of a system.

FIG. 5 illustrates a FBDIMM. This module type is made up of a metal cooling element 6. The cooling element 6 extends over the whole length of the printed circuit board 2. The cooling element 6 may also cover more than one electronic component 1. The stack composed of the printed circuit board 2, the frame 4 (optional), the conductive elastomer 3 (not illustrated in this Figure), the electronic component 1 and the cooling element 6 is held together by the two clips 5. Thus, the cooling element 6 fulfills a dual function: a) cooling of the electronic component(s) 1 and b) applying the force necessary to keep the attached DRAM components in place.

The method described above for fixing an electronic component 1 onto a printed circuit board 2 by using a conductive elastomer sheet 3 can also be used to mount the electronic component 1 for testing purposes only. In this case, a clamping means can be used that exerts a pressure only over a given period of time.

Using a conductive elastomer to attach a chip it is possible to leave out the usual package thus additionally saving costs. This is a vital aspect of the present invention. Today's packages serve two purposes: a) allow re-routing of the signals and b) to accommodate the solder balls needed to solder the chip to the printed card board. This the invention described here, the package can be removed in case the re-routing is done on-chip.

From the foregoing it is apparent that embodiments of the present invention have been made to provide a method of fixing electronic components onto a printed circuit board (PCB).

According to one embodiment, there is provided a method including: depositing an elastic, anisotropically conductive material onto a surface of a printed circuit board at a position where an electronic component is to be fixed; placing the electronic component on the elastic, anisotropically conductive material; exerting a force onto the electronic component in direction of the surface of the printed circuit board in order to fix the electronic component on the printed circuit board. This way a stable connection between the electronic component and the PCB is established. This method allows also an easy removal of the electronic component if the electronic component is to be replaced for some reasons (rework).

There is further provided a system including at least one electronic component and a printed circuit board (PCB) wherein the electronic component is fixed onto the printed circuit board by an elastic, anisotropically conductive material so that connector pins of the electronic components make a contact with corresponding connectors of the printed circuit board.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system comprising:
an electronic component;
a printed circuit board;
an elastic, anisotropically conductive material between the electronic component and the printed circuit board, so that the electronic component is in contact with the printed circuit board via the elastic, anisotropically conductive material;
at least one mechanical means which exerts a permanent force onto the electronic component in the direction of the printed circuit board; and
a cooling body which covers at least partly the surface of the electronic component, a part of which goes beyond the surface of the electronic component, wherein the at least one mechanical means is placed so that the cooling body and electronic component are sandwiched between the mechanical means and the printed circuit board, the electronic component being sandwiched between the cooling body and the printed circuit board.

2. The system of claim 1, comprising wherein the elastic, anisotropically conductive material is an elastomer sheet containing metallic particles therein.

3. The system of claim 2, comprising wherein the metallic particles are pieces of conductive wire or metallic balls.

4. The system of claim 1, comprising wherein the circuit board comprises several electronic components fixed onto the circuit board wherein at least one of the electronic components is a DRAM.

5. The system of claim 1, comprising wherein the position of the electronic component is determined by a frame fixed onto the circuit board.

\* \* \* \* \*